United States Patent [19]

Mallik et al.

[11] Patent Number: 4,835,120
[45] Date of Patent: May 30, 1989

[54] METHOD OF MAKING A MULTILAYER MOLDED PLASTIC IC PACKAGE

[76] Inventors: Debendra Mallik, 2139 S. Cottonwood, Mesa, Ariz. 85202; Bidyut K. Bhattacharyya, 5063 W. Boston Way, Chandler, Ariz. 85226

[21] Appl. No.: 212,882

[22] Filed: Jun. 29, 1988

Related U.S. Application Data

[62] Division of Ser. No. 2,144, Jan. 12, 1987.

[51] Int. Cl.⁴ .......................................... H01L 21/28
[52] U.S. Cl. .................................. 437/209; 437/220; 437/224; 174/52.2; 264/272.11
[58] Field of Search ................. 437/209, 220, 224; 174/52 PE; 264/272.11

[56] References Cited

U.S. PATENT DOCUMENTS

| | | | |
|---|---|---|---|
| 3,784,883 | 1/1974 | Duncan et al. | 317/234 |
| 4,168,507 | 9/1979 | Yester | 357/51 |
| 4,259,436 | 3/1981 | Tabushi et al. | 437/209 |
| 4,410,905 | 10/1983 | Grabbe | 437/209 |
| 4,475,007 | 10/1984 | Ohno | 437/209 |
| 4,541,035 | 9/1985 | Carlson et al. | 361/414 |
| 4,577,214 | 3/1986 | Schaper | 357/80 |
| 4,595,945 | 6/1986 | Graver | 357/70 |
| 4,608,592 | 8/1986 | Miyamoto | 357/74 |
| 4,639,760 | 1/1987 | Granberg et al. | 357/75 |
| 4,640,436 | 2/1987 | Miyoshi et al. | 174/525 |
| 4,663,833 | 7/1987 | Tanaka et al. | 357/72 |
| 4,674,175 | 6/1987 | Stampfli | 437/209 |
| 4,675,717 | 6/1987 | Herrero et al. | 357/80 |
| 4,680,613 | 7/1987 | Daniels et al. | 357/70 |
| 4,705,917 | 11/1987 | Gates et al. | 357/74 |

FOREIGN PATENT DOCUMENTS

| | | |
|---|---|---|
| 1245710 | 12/1969 | United Kingdom . |
| 1499889 | 2/1975 | United Kingdom . |
| 2107116 | 9/1982 | United Kingdom . |

Primary Examiner—Brian E. Hearn
Assistant Examiner—Beverly A. Pawlikowski
Attorney, Agent, or Firm—Blakely, Sokoloff, Taylor & Zafman

[57] ABSTRACT

A multi-layered molded plastic package for encapsulating an integrated circuit is described. The package includes a carrier having a double-layered metal plate which are separated by an adhesive coated insulation tape. A second insulating tape layer is used to bond externally extending leads onto one of the metal plates. Power and ground connections from the terminal of the integrated circuit are made to each of the plates, respectively, as are the power and ground lead connections to the two plates. The power and ground planes remove the requirement for direct physical connection between the power and ground terminals of the integrated circuit and their respective leads.

2 Claims, 5 Drawing Sheets

U.S. Patent    May 30, 1989    Sheet 1 of 5    4,835,120
FIG_1
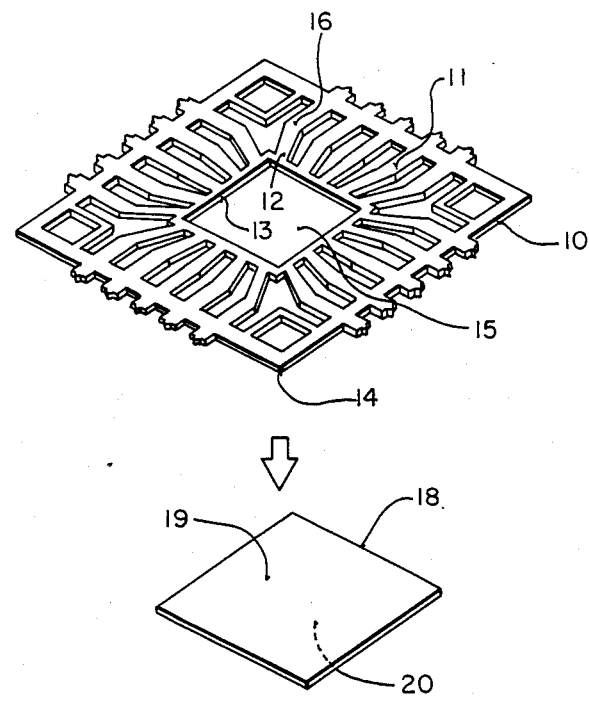
FIG_2
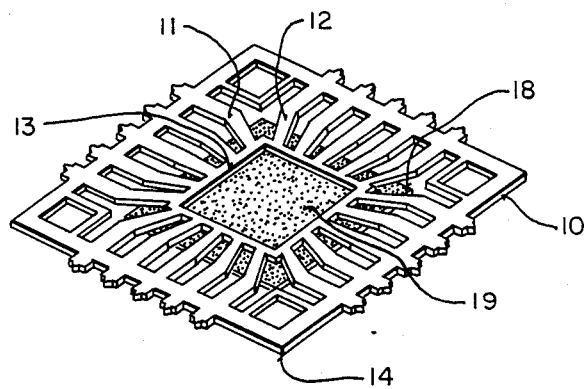
FIG_3
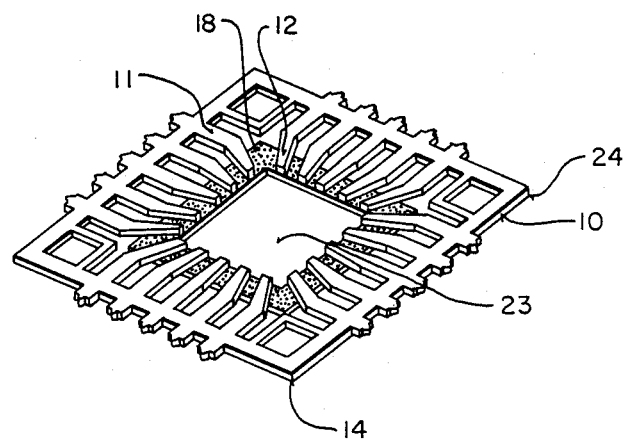

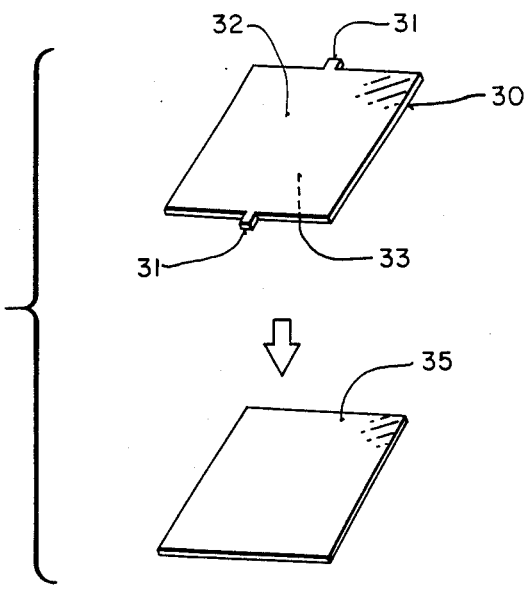
FIG_4
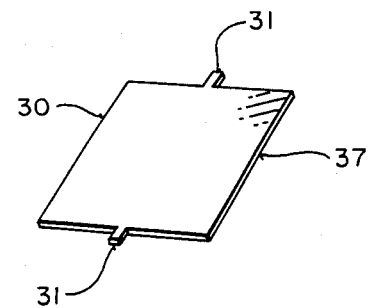
FIG_5
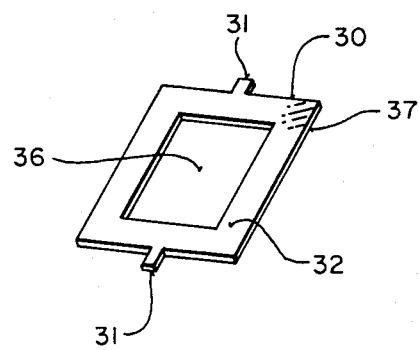
FIG_6

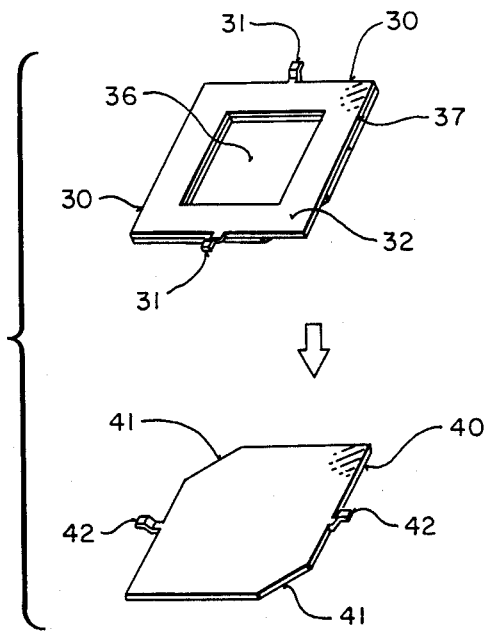
FIG_7
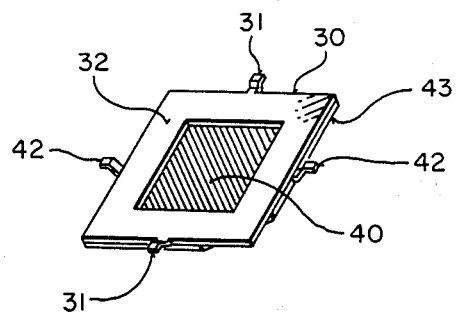
FIG_8

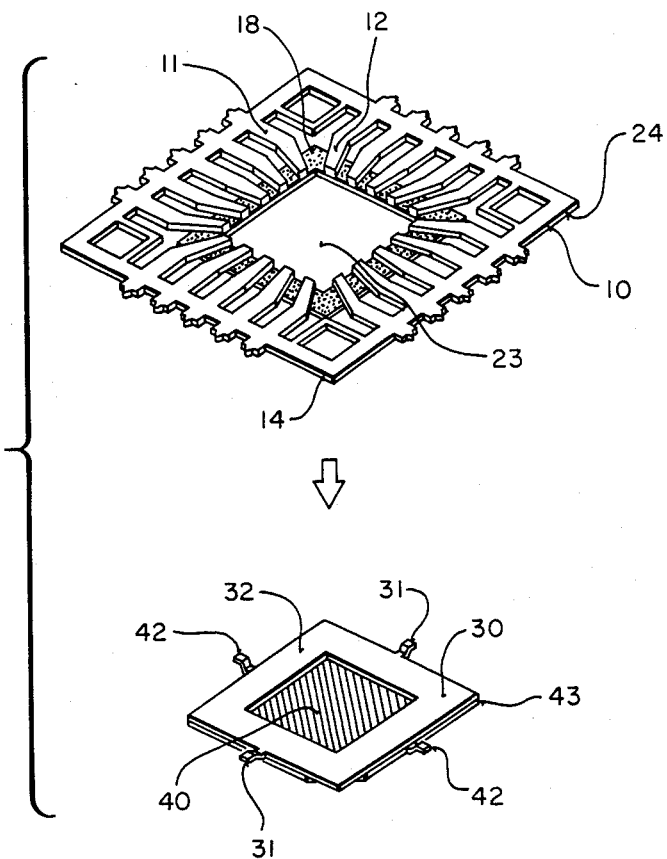
FIG_9
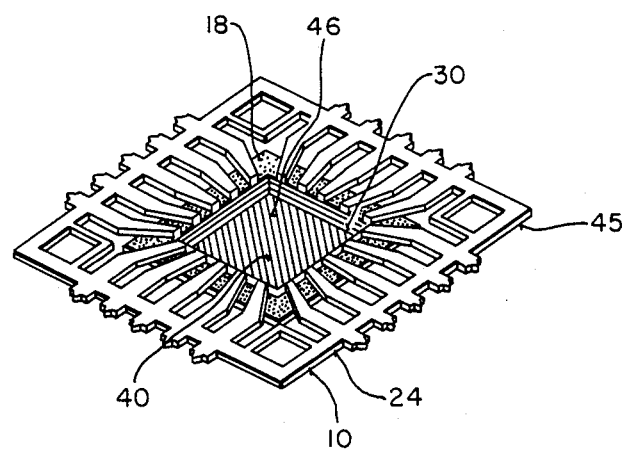
FIG_10

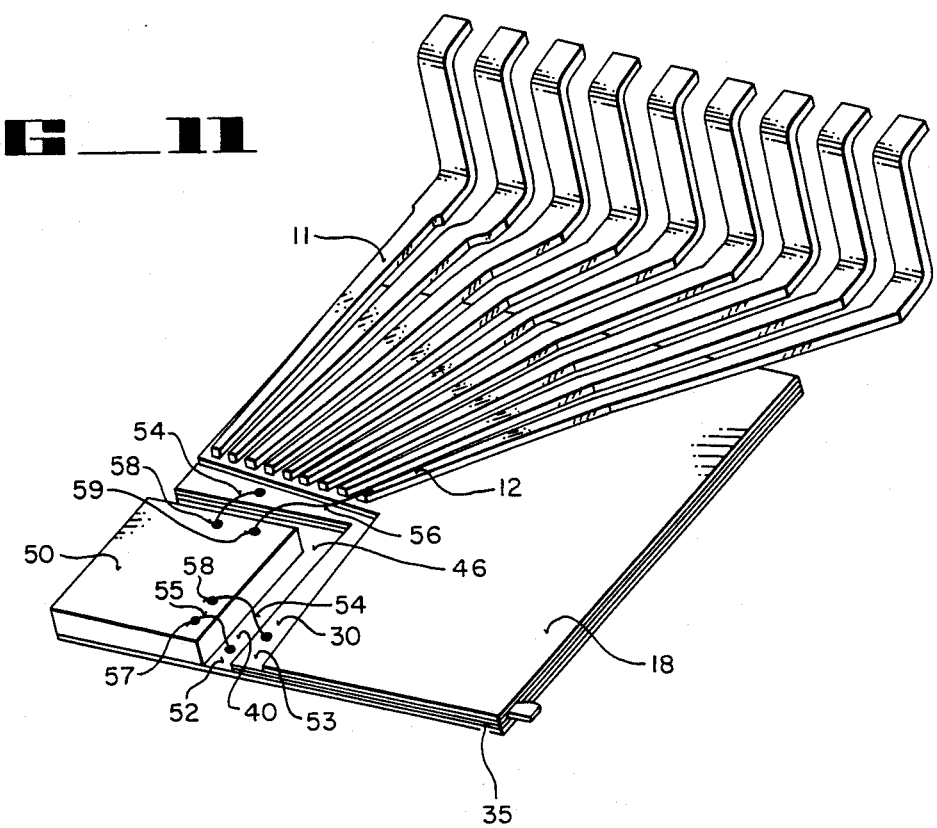
FIG_11
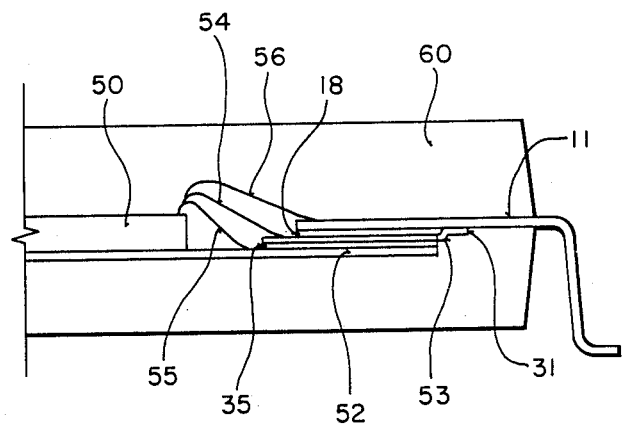
FIG_12

METHOD OF MAKING A MULTILAYER MOLDED PLASTIC IC PACKAGE

This is a (divisional) of application Ser. No. 002,144 filed 01/12/87.

BACKGROUND OF THE INVENTION

1. Field of the Invention

The relates to the field of plastic encapsulation of semiconductor devices and more specifically to the encapsulation of multi-lead integrated circuits within a plastic carrier.

2. Prior Art

During the early development of encapsulating integrated circuits, the integrated circuits were typically packaged in a metal or a ceramic shell. Although ceramic encapsulation is effective, ceramic insulation is costly and reflect a sizable percentage of the total cost of manufacturing an integrated circuit chip. More recently, plastic encapsulation techniques have been devised which substantially lower the cost of packaging an integrated circuit device.

In a typical plastic packaging technique, an integrated circuit, usually in a form of a die, is placed proximate to a leadframe. The chip or the die is then wired such that various terminals of the integrated circuit are physically connected to the leads of the leadframe by wires. Next, the integrated circuit chip is bonded and potted such that the chip is encapsulated within the plastic package and only the leads extend externally of the package.

The conventional single-layer molded plastic package using metal leads as known in the prior art typically require one-to-one connection of the various integrated circuit terminals on the die to the leads. The number and position of power and ground leads of the package were directly dependent on the number and position of the power and ground bond pads on the die. Although multiple connections could be made to the various power and ground leads from the die pads, such practice places additional constraint in positioning the various pads. Also, in certain high current applications, additional pads and leads are needed to shunt the additional current. Increase in the number of power and ground pads on the die which result in the increase in the number of leads ultimately cause high electrical inductance and low capacitance to exist between the power and ground pads, such that these properties cause low speed response of the integrated circuit. Further, increase in the number of bond pads on a single layer package dictates an increase in the package lead count resulting in an increase in the size of the package and inhibiting any attempt at package shrink.

Also due to the fact that a single layer molded plastic package is basically flat and causes all I/O (input/output) to ground lead current loops to lie in one plane, cross talk on high lead count packages is appreciably significant to cause communication degradation.

Where prior art single-layer molded plastic packages are quite adequate for various low lead count or low speed integrated circuits, a high lead count, high speed integrated circuit implemented in a compact plastic package is difficult to achieve using prior art techniques. It is appreciated then that what is needed is a plastic package for encapsulating a high speed, high lead count integrated circuit, such as a 32-bit microprocessor chip, in a compact system.

SUMMARY OF THE INVENTION

The present invention discloses a multi-layered molded plastic package for encapsulating an integrated circuit. The plastic package includes a multi-layered carrier having a power plane and a ground plane, which are formed from flat metal plates. The power plane operates as a base and the ground plane is disposed to overlie the power plane. A center area of the ground plane is stamped out to provide an opening for the placement of the integrated circuit.

A tape having a polyimide adhesive is used to bond the two plates together and also to act as an insulator. Then a second insulation tape layer using the polyimide adhesive is used to bond leads to the second plate. After attaching the integrated circuit onto the power plane in the opening provided within the ground plane, wires are used to couple power pads on the integrated circuit to the power plane and ground pads to the ground plane.

The use of ground and power planes removes the requirement of directly connecting ground and power terminals to various ground and power leads. The use of the ground and power planes reduces package size, improves thermal performance and reduces lead and mutual inductance.

BRIEF DESCRIPTION OF THE DRAWINGS

FIG. 1 shows a leadframe and an adhesive coated insulation tape which is bonded onto the leadframe.

FIG. 2 shows a completed assembly of FIG. 1.

FIG. 3 shows the assembly of FIG. 2 after stamping out a center area and removing an inner ring holding various lead tips in place.

FIG. 4 shows a ground plane and a second adhesive coated insulation tape.

FIG. 5 shows a completed assembly of FIG. 4.

FIG. 6 shows the completed assembly of FIG. 5 with a center opening stamped out.

FIG. 7 shows the assembly of FIG. 6 being joined to a power plane.

FIG. 8 shows the completed assembly of FIG. 7.

FIG. 9 shows the bonding of the leadframe of FIG. 3 and the double-layered plate assembly of FIG. 8.

FIG. 10 shows the completed assembly of FIG. 9.

FIG. 11 shows a portion of the assembly of FIG. 10 and the bonding of an integrated circuit and some of its terminal connections.

FIG. 12 shows a cross-sectional view of a completed package of the present invention.

DETAILED DESCRIPTION OF THE PREFERRED EMBODIMENT

A multi-layer molded plastic integrated circuit package which provides for a compact encapsulation is described. In the following description, numerous specific details are set forth such as specific shapes, material, etc., in order to provide a thorough understanding of the present invention. It will be obvious, however, to one skilled in the art that the present invention may be practiced without these specific details. In other instances, well-known techniques have not been described in detail in order not to unnecessarily obscure the present invention.

Referring to FIG. 1, a leadframe is shown having a plurality of leads 11 held in place by an outer ring 14. Lead tips 12 are held in place by inner ring 13 to prevent damage to them. Leadframe 10 is constructed from a number of various metals which are well-known in the prior art for constructing leads. Leadframe 10 of the present invention is flat and is formed by stamping or etching it from a desired metal sheet. Inner ring 13 functions as a boundary for opening 15 at the center of the leadframe 10. Inner ring 13, outer ring 14 and opening 15 of the preferred embodiment is square in shape to accommodate a square-shaped integrated circuit (IC), however, any such shape being arbitrary and determined by the shape of the integrated circuit which will reside within the opening 15. As practiced with the present invention, the lead tips 12 are silver plated on upper surface 16 by a well-known prior art process for subsequent gold wire bonding.

An insulation tape 18, such as Kapton TM tape manufactured by E. I. du Pont de Nemours & Co., which is coated with a polyimide adhesive on both surfaces 19 and 20 is used. Polyimide coated tape 18 is cut such that its dimensions are larger than opening 15 of leadframe 10. Surface 19 of tape 18 is placed against non-silver plated side of leadframe 10 such that tape 18 covers opening 15. Leadframe 10 and tape 18 are subjected to a hot tack operation well-known in the prior art to adhere tape 18 to lead frame 10. However, during this hot tack process, the adhesive coating on surfaces 19 and 20 are not completely cured. FIG. 2 shows the completion at the end of the hot tack process, wherein tape 18 and leadframe 10 are joined to enclose opening 15. Although a particular material and adhesive are used in the preferred embodiment, it is appreciated that other insulators and adhesives well-known in the prior art will perform an equivalent function.

Referring to FIG. 3, a center opening 23 is formed by stamping out a portion of tape 18 and inner ring 13. At this stage tape 18, having an opening 23, is attached to lead tips 12. The various leadtips 12 are separated from each other due to the removal of inner ring 13. The boundary dimensions of opening 23 must be of such size as to accommodate an IC chip or die within opening 23. At this stage of manufacture, assembly 24 is formed.

Referring to FIG. 4, a metal plate 30 is stamped to have dimensions substantially similar to the dimensions of tape 18 of FIG. 1. Plate 30 of the preferred embodiment is formed from copper material and is silver plated on one surface 32. Plate 30 includes tabs 31 which will mate with appropriate leads 11 of leadframe 10 of FIG. 3. Tabs 31 are raised slightly from the plane of plate 30. Tabs' 31 surfaces are treated by a metallurgical process, such as gold or nickel plating, to help bond tabs 31 to leadframe 10. The preferred embodiment uses gold plating on tabs 31. Then, tape 35 having polyimide adhesive on both sides is cut to match the dimensions of plate 30 and then by the use of the polyimide adhesive as previously explained in reference to FIG. 1 is mated to the non-plated side 33 of plate 30 by the hot tack process. The resulting attachment of plate 30 to tape 35 is shown in FIG. 5 as unit 37.

Referring to FIG. 6, opening 36 is stamped in plate unit 37. Opening 36 has dimensions to enable IC die to be placed within. However, opening 36 has dimensions which are smaller than opening 23 of FIG. 3 such that portion of surface 32 of unit 37 will reside within opening 23 when properly mated.

Referring to FIG. 7, a metal plate 40 constructed from a material equivalent to that of plate 30 of FIG. 4, is stamped to have dimensions substantially equivalent to that of plate 30. In the preferred embodiment opposing corners 41 are notched to have a slight angular cut.

Tabs 42 are formed in an equivalent manner to that of tabs 31 of plate 30 of FIG. 4 to mate with various corresponding leads 11 which will be coupled to plate 40. Tabs 42 are positioned at separate locations than tabs 31. Plate unit 37 is mated to plate 40 such that polyimide coated tape 35 is sandwiched between plate 30 and 40. The completed combination of mated plate 30, tape 35 and plate 40 is shown in FIG. 8 as assembly 43.

Referring to FIG. 9, assembly 24 is now mated to assembly 43 such that tape 18 is sandwiched between leadframe 10 and plate 30. The completed assembly 45, having a center area 46, is shown in FIG. 10. The preferred embodiment is comprised of a substantially flat and square assembly 45, although such shape being arbitrarily dependent on the size and shape of the integrated circuit being encapsulated. Then, assembly 45 is cured under thermo-compression to permanently join all elements 10, 18, 30, 35, 40. Assembly 24 is comprised of plate 40 which functions to provide a base for area 46. Tape 35 and plate 30 overlie plate 40. Next, tape 18 and leads 11 of leadframe 10 overlie plate 30, such that a portion of plate 30 is exposed. In the preferred embodiment, plate 40 forms a power plane 52 and plate 30 forms a ground plane 53.

The tabs 31 and 42 when properly formed will extend past the outer boundary of tape 18. Due to the slight rise, the tabs 31 and 42 will extend from its respective plates 30 and 40 to mate with various corresponding leads 11 along their underside. The tabs 31 and 42 are bonded to the leads 11 by using one of various prior art methods, such as parallel gap welding, ultrasonic bonding, compliant bonding, wobble bonding, or thermo-compression (pulsed solder reflow).

Referring to FIG. 11, an IC in a form of a die 50 is placed within the center area 46 to lie upon power plane 52. A variety of prior art techniques, such as adhesive die attach, is utilized to bond die 50 onto power plane 52. Wires 55 are used to couple pad 57 on die 50 to power plane 52 and wires 54 are bonded to couple pads 58 to ground plane 53. Other wires, such as wire 56, are used to couple other pads 59 of die 50 to various leads at lead tip 12.

Referring also to FIG. 12, the proper positioning of the various tabs 31 and 42 in the earlier formation of the ground and power planes is apparent in that tabs 31 and 42 mate with appropriate leads 11 to couple the ground plane 53 and the power plane 52. In the preferred embodiment, tabs 31 and 42 are bonded prior to the placement of wires 54–56 as earlier described. Although only one of the ground plane tabs 31 is shown in the FIGS. 11 and 12, the other ground tabs 31 and power tabs 42 are mated to their respective leads 11 in an equivalent manner. The various wire bondings are accomplished by bonding wires 54–56 to the silver spot-plated planes 52–53 and to the silver-plated lead tips 12.

It is appreciated that various bonding techniques or configurations may be utilized to practice the present invention. In an alternate embodiment, instead of using tabs 31 and 42 at the outer edge of the planes 52 and 53, heavy gage wires may be utilized to interconnect the ground and the power planes at lead tips 12. Further, decoupling capacitors can be surface mounted on the plane between the power and the ground plane. Finally, the complete unit is encapsulated in a plastic package 60 by a well-known stamping and forming process used in the manufacture of semiconductor devices, outer ring 14 of lead frame 10 is removed and various leads 11 are separated to form individual leads 11 of an IC package.

Assembly 45 is worked by a well-known conventional plastic package assembly technique.

Various advantages are derived due to the performance improvement of the present invention. A critical improvement is that the inductance of power and ground paths of the IC will be drastically reduced, because major portions of the lead length is replaced by low inductance metal planes. Capacitance of the power and ground paths will also increase to a value typically near 100 pF thereby helping to reduce noise in the power supply. As stated earlier, decoupling capacitors can be placed within the package connecting the ground and power planes to further reduce the lead inductance of the IC. The lead inductance is determined, not only by the leads 11, but also by the lead length in the external circuit. That is, the presence of the ground and power planes will reduce the inductance of various I/O lines which will be coupled to the leads 11 of the IC and will aid in maintaining a more uniform value of inductance per unit length. Therefore, the present invention will result in a package which will not be highly geometry dependent as was the case in prior art devices without the use of ground and power planes.

Unlike in prior art plastic packages without the use of ground and power planes, the present invention does not require a one-to-one connection of the power and ground terminals on the die to the leads, thereby providing independent control over the position and number of the ground and power terminals on the die and on the package leads. Also, because of the favorable gains in the package inductance and capacitors the number of ground and power leads required for equivalent performance is much less compared to prior art devices.

The overall contribution of the various advantages in performance will result in smaller package sizes for the device. The use of metal plates as ground and power planes also contributes to the distribution of heat generated by the IC, thereby presenting a thermal performance improvement. For "hot devices" this will eliminate the need for internal "heatspreaders".

Other advantages which result from the practice of the present invention are as follows: During the manufacturing process, the lead tips in the leadframe are protected by adhesive coated tapes and by the metal ring, thereby preventing damage. When tabs are used, the ground and power lead tips need not be present for wire bonding such that the ground and power lead tips can be cut back with respect to other lead tips, freeing crucial real estate near the IC wire bonding areas. Further, die pads no longer need the support of tie bars, such that further real estate is available for additional I/O leads. Also, mutual inductance between the leads, as well as between the I/O lines, will be reduced because current loops between power and ground potential occur perpendicular to the planes and not between the leads, as was the case in the prior art.

Thus a multi-layer plastic package for encapsulating an integrated circuit is described.

We claim:

1. A method of encapsulated an integrated circuit in a plastic package comprising the steps of:
preparing a leadframe having a plurality of leads disposed therein, said leadframe having a central opening for placement of said integrated circuit;
cutting a first adhesive coated insulation tape to fit over said opening;
bonding said first insulation tape to the bottom side of said leadframe to form a leadframe assembly;
stamping a center opening in said tape;
cutting a first plate;
bonding said first plate to the bottom of said first tape such that said first tape is disposed between said first plate and said leadframe;
cutting a second adhesive coated insulation tape;
bonding said second insulation tape to the bottom of said first plate;
stamping out a center opening in said second tape and said first plate; cutting a second plate;
bonding said second plate to the bottom of said second insulation tape such that said second tape is disposed between the bottom of said first plate and the top of said second plate;
bonding said integrated circuit to the top of said second plate;
bonding wires to various terminal pads on said integrated circuit;
terminating other end of said wires to various leads of said leadframe and to said first and second plates;
coupling ground and power terminals of said integrated circuit to ground and power leads by said first and second plates;
encapsulating in a plastic shell.

2. A method of encapsulating an integrated circuit die in a plastic package comprising the steps of:
preparing a leadframe from a substantially planar metal sheet and having a plurality of leads disposed therein and held in position by an inner ring, said leadframe having a central opening for placement of said integrated circuit;
silver-plating the upper surface of the tips of said plurality of leads;
cutting a first adhesive coated insulation tape larger than said opening and extending to the outer edge of said inner ring;
bonding said first insulation tape to the non-silvered side of said leadframe to form a leadframe assembly;
stamping a center opening in said tape simultaneously removing said inner ring;
cutting a first plate dimensionally similar to the external dimensions of said first installation tape and having a pair of angular extensions opposed from one another;
bonding said first plate to the bottom of said first tape such that said first tape is disposed between said first plate and the non-silvered side of said leadframe;
cutting a second adhesive coated insulation tape dimensionally similar to said first plate;
bonding the upper surface of said second insulation tape to the bottom surface of said first plate;
stamping out a center opening dimensionally similar to said integrated circuit die in said second tape and said first plate;
cutting a second plate equivalent to said first plate;
bonding the upper surface of said second plate to the bottom surface of said second insulation tape such that said second insulation tape is dispose between said the bottom surface of first plate and the upper surface of second plate;
bonding said integrated circuit to the upper surface of said second plate;
bonding wires to various terminal pads on said integrated circuit die;

terminating other end of said wires to various corresponding leads of said leadframe and to said first and second plates;

coupling ground and power terminals of said integrated circuit to ground and power leads by said angular extensions of said first and second plates;

encapsulating said lead frame assembly, said first and second plates and said integrated circuit die in a molded plastic shell.

* * * * *

UNITED STATES PATENT AND TRADEMARK OFFICE
CERTIFICATE OF CORRECTION

PATENT NO. : 4,835,120

DATED : 05/30/89

INVENTOR(S) : Mallik et al.

It is certified that error in the above-identified patent and that said Letters Patent is hereby corrected as shown below:

| | | |
|---|---|---|
| col. 01, line 10 | before "relates" | insert --present invention-- |
| col. 03, line 36 | delete "!" | insert --1-- |
| col. 06, line 62 | delete "dispose" | insert --disposed-- |

Signed and Sealed this

Twelfth Day of February, 1991

Attest:

HARRY F. MANBECK, JR.

Attesting Officer

Commissioner of Patents and Trademarks